(12) United States Patent
Matsumoto

(10) Patent No.: US 7,038,240 B2
(45) Date of Patent: May 2, 2006

(54) COLOR DISPLAY DEVICE

(75) Inventor: Shoichiro Matsumoto, Ogaki (JP)

(73) Assignee: Sanyo Electric Co., Ltd., (JP)

( * ) Notice: Subject to any disclaimer, the term of this patent is extended or adjusted under 35 U.S.C. 154(b) by 91 days.

(21) Appl. No.: 10/789,720

(22) Filed: Feb. 27, 2004

(65) Prior Publication Data

US 2004/0173819 A1   Sep. 9, 2004

(30) Foreign Application Priority Data

Mar. 3, 2003   (JP) .............................. 2003-055854

(51) Int. Cl.
*H01L 31/109* (2006.01)

(52) U.S. Cl. ........................... 257/59; 257/59; 257/200

(58) Field of Classification Search ................... 257/59, 257/89, 72, 228

See application file for complete search history.

(56) References Cited

U.S. PATENT DOCUMENTS 5,610,736 A * 3/1997 Asai ........................... 349/42

* cited by examiner

*Primary Examiner*—David Nelms
*Assistant Examiner*—Thinh T Nguyen
(74) *Attorney, Agent, or Firm*—Cantor Colburn LLP

(57) ABSTRACT

A color display device comprises a plurality of pixel regions having different areas, which may be realized by differences in the horizontal width, corresponding to different color components. Each pixel region is provided with a first thin film transistor for selectively supplying a signal corresponding to a display information to the pixel region, and a storage capacitor connected to the first thin film transistor for retaining the signal corresponding to the display information. A plan view distance obtained by projecting onto a display plane surface an extent from the capacitor-side end portion of a gate of the first thin film transistor to the storage capacitor is configured identical in the respective pixel regions. With this arrangement, the need to adjust for each color component the writing time and rate of the signal supplied via the first thin film transistor can be eliminated, even when the pixel regions have different areas.

9 Claims, 8 Drawing Sheets

COLOR DISPLAY DEVICE

BACKGROUND OF THE INVENTION

1. Field of the Invention

The present invention relates to a color display device using a self-emissive element, such as an electroluminescence (EL) element, and a thin film transistor (TFT), and a method for designing a display device.

2. Description of the Related Art

There is today active development of flat panel display devices with reduced thickness and low power consumption as potential replacements for CRTs. One well-known type of flat panel display device is a liquid crystal display (LCD). In recent years, research has also being directed to development of an EL display device using self-emissive EL elements. In one known method for achieving color display in such flat panel display devices, self-emissive elements such as those used in an EL display device, which are composed of different materials for emitting the respective lights of R, G, and B, may be provided in corresponding pixel regions, so as to produce a full color display using a combination of light from the plurality of pixel regions.

In an EL element, and particularly referring to an organic EL element which employs an organic compound as the emissive material, the lifetime of the organic layer of the element very greatly influences the usable life of the entire color display device. The life of an organic layer differs for each emissive material. Accordingly, when using different materials for the respective emitted colors, achieving uniform EL material life for the respective color components leads to attaining a longer working life for display itself.

One method for attaining longer device life is to vary the size of the emissive region (region in which light is visible) in accordance with the characteristic of the EL material for each of the color components. Because an EL element life depends on the density of current that is made to flow in the element, the life can be effectively extended by minimizing the current density. Accordingly, for a short-life EL element, a desired luminance level may be achieved at a low current density by maximizing the element area.

FIG. 1A is a schematic plan view showing a widely used configuration of an active matrix type EL display device, which includes a thin film transistor in each pixel region for individually controlling light emission from each EL element. Gate signal lines 151 are formed along the horizontal direction, while drain (data) signal lines 152 and drive power lines 153 are formed along the vertical direction. Each pixel region is arranged generally in a region surrounded by gate signal lines 151, a drain signal line 152, and a drive power line 153. In a typical configuration, each pixel region includes a first TFT 110, storage capacitor Cs, second TFT 120, and EL element 170. The first TFT 110 is driven by a gate signal line 151 and functions as a switching element for capturing a data signal corresponding to a display information from a drain signal line 152. The storage capacitor Cs is connected to a source region 113s of the first TFT 110, for example, which is located on a side opposite from the drain signal line 152. A voltage corresponding to the data signal is applied to the storage capacitor Cs via the drain region 113d and the source region 113s. The storage capacitor Cs retains this voltage for a predetermined duration until the point when the TFT 110 is selected again and a new data signal is written. The second TFT 120 includes a gate 125 connected to the storage capacitor Cs (and to the first TFT 110 via the storage capacitor Cs), and serves to supply, from a drive signal line 153 to the organic EL element 170, a current corresponding to a voltage applied to the gate 125.

When the pixel area of every pixel region is equal, the layout of the components may be as shown in FIG. 1A. Based on this arrangement, a simple method for varying the areas (emissive regions) among the plurality of pixel regions arranged in a matrix may be to change the pixel region width in the horizontal direction for each color component, as shown in FIG. 1B for example. When varying the area of the pixel region for each color component in this manner, it is unnecessary to change the connection relationship between the signal lines and the first TFT 110. Accordingly, the relative position between the first TFT 110 and the gate and drain signal lines 151, 152 to which the first TFT 110 is connected need not be altered. Consequently, as shown in FIG. 1B, the size Ld (Lnd, LGd, LRd) of the drain region 113d of the first TFT 110 connected to the drain signal line 152 remains identical in each of the pixel regions correlated to R, G, and B. In contrast, the distance Ls (plan view distance projected onto the display plane surface) from the source region 113s, which is located on one side of a channel region 113c opposite from the drain region 113d, to the storage capacitor Cs (the region where the storage capacitor electrode 55 and the capacitor electrode line 54 overlap) connected to the source region 113s is varied between the pixel regions correlated to different color components.

When the distance Ls (LBs, LGs, LRs) is varied, differences result in the load LOs generated between the first TFT 110 and the storage capacitor Cs among the respective pixel regions. Consequently, the length of time during which a signal from the drain signal line 152 is written into the storage capacitor Cs and the gate of the second TFT 120 via the first TFT 110 becomes different for each color component, and uniformity is not attained. When using this configuration, because an EL element has a high emissive sensitivity with respect to a supplied current, variances in emissive luminance level among the pixel regions may likely result unless the device drive is controlled taking into consideration such differences in the conditions for writing into the second TFT 120. Further, because a pixel region having a larger width compared to those for other color components includes extra space, it may be devised to enlarge the storage capacitor Cs into the extra space to enhance memory performance. However, such a structure serves to actively vary the size of the storage capacitor Cs, namely, the charge accumulation capacity, in the respective pixel regions corresponding to different color components. Differences in the conditions for writing a data signal into the storage capacitor Cs via the first TFT thereby become larger among the pixel regions. As a result, adjustments and individual control for optimization in accordance with each color component becomes necessary, leading to not only an increase in design workload but also variances in adjustments and control. Such variances may lead to degradation in the uniformity of display (emissive luminance).

SUMMARY OF THE INVENTION

The present invention, which includes features as described below, achieves an improved color display device which can easily be designed and driven.

A color display device according to the present invention comprises a plurality of pixel regions each correlated to a predetermined color component, Each of the plurality of pixel regions includes a first thin film transistor for selectively supplying a signal corresponding to a display information to the pixel region, and a storage capacitor connected to the first thin film transistor for retaining the signal corresponding to the display information. The plurality of pixel regions are of equal length in a first direction, while a pixel region correlated to a predetermined color component is, in a second direction, of a length which differs from a length of a pixel region correlated to at least one other color component. A channel length direction of the first thin film transistor is arranged along a third direction intersecting the first direction. A plan view distance obtained by projecting onto a display plane surface an extent from an end portion of a gate of the first thin film transistor to the storage capacitor is identical in the respective pixel regions.

According to another aspect of the present invention, a color display device comprises a plurality of pixel regions each correlated to a predetermined color component. Each of the plurality of pixel regions includes a first thin film transistor for selectively supplying a signal corresponding to a display information to the pixel region, and a storage capacitor connected to the first thin film transistor for retaining the signal corresponding to the display information. The plurality of pixel regions are of equal length in a first direction, while a pixel region correlated to a predetermined color component is, in a second direction, of a length different from a length of a pixel region correlated to at least one other color component. A channel length direction of the first thin film transistor is arranged along a third direction intersecting the first direction. A load generated between a channel end portion of the first thin film transistor and the storage capacitor is approximately equal in the respective pixel regions.

According to a further aspect of the present invention, a color display device comprises a plurality of pixel regions each correlated to a predetermined color component. Each of the plurality of pixel regions includes a first thin film transistor for selectively supplying a signal corresponding to a display information to the pixel region, and a storage capacitor connected to the first thin film transistor for retaining the signal corresponding to the display information. The plurality of pixel regions are of equal length in a first direction, while a pixel region correlated to a predetermined color component is, in a second direction, of a length different from a length of a pixel region correlated to at least one other color component. A channel length direction of the first thin film transistor is arranged along a third direction intersecting the first direction. A plan view distance obtained by projecting onto a display plane surface an extent from a gate end portion of the first thin film transistor on the storage capacitor side to the storage capacitor is identical between the pixel regions having at least emissive areas different from one another In a color display device as described above, according to a still further aspect of the present invention, a plan view distance obtained by projecting onto a display plane surface an extent from a gate end portion of the first thin film transistor on a data signal line side to a contact location connecting the data signal line and the first thin film transistor is identical between the pixel regions having at least emissive areas different from one another.

According to a further aspect of the present invention, each of the plurality of pixel regions further includes a pixel electrode and a second thin film transistor connected to the pixel electrode. A gate of the second thin film transistor is connected to the storage capacitor and the first thin film transistor. Moreover, a load generated between the data signal line and the pixel electrode is identical in the plurality of pixel regions correlated to different color components.

According to still another aspect of the present invention, each of the plurality of pixel regions further includes a second thin film transistor electrically connected to the first thin film transistor and the storage capacitor, and an emissive element connected to the second thin film transistor for emitting light in accordance with the signal corresponding to the display information supplied via the first thin film transistor.

Furthermore, the emissive element may be a current-driven electroluminescence element.

According to the present invention as described above, at least the first thin film transistor and the storage capacitor, which are present in the path for capturing and retaining the signal corresponding to the display information, are formed in shapes identical among the respective pixel regions, while the sizes of the pixel regions (e.g., the length in the second direction such as the horizontal direction, or pixel width) may be varied for each of the color components. Accordingly, even when the pixel regions have different areas, load (such as parasitic resistance and parasitic capacitance) in the signal path can be made equal in the respective pixel regions. A signal from the data signal line can therefore be written into the respective storage capacitors in a uniform manner under the same conditions (i.e. the writing can be performed using an equal amount of time and at an equal rate). It should be noted that the storage capacitors, for example, may also be created to have capacitance values equal to one another while having different shapes by providing identical capacitance areas (sizes), thereby achieving the same conditions for the respective pixels. From a design perspective, the shapes are preferably identical in the respective pixels, such that the magnitude of load in each pixel can be very easily made uniform. Using this configuration, the thin film transistors and the storage capacitors provided in the pixel regions corresponding to different color components need not be separately designed. A design within a pixel region correlated to one color component can be reflected in a design within a pixel region corresponding to another color component, allowing time required for design to be greatly reduced. Furthermore, the need to vary the drive conditions (such as the signal waveform and strength) in accordance with different pixel areas (such as emissive areas) is eliminated, thereby facilitating drive control. Moreover, no special processing on the drive circuit side is required when a pixel area is changed in accordance with color.

Further, according to the present invention, not only the load generated between the first thin film transistor and the storage capacitance, but also the load between the first thin film transistor and the signal line can be correlated to each of the color components, such that the load values are made equal among the pixel regions having different areas. The same can be achieved with respect to the load between the first thin film transistor and the second thin film transistor connected to a display element such as an emissive element, or the load between the first thin film transistor and the display element. With this arrangement, layout design and designation of drive conditions can be further facilitated.

DESCRIPTION OF THE PREFERRED EMBODIMENTS

Figure 1A:
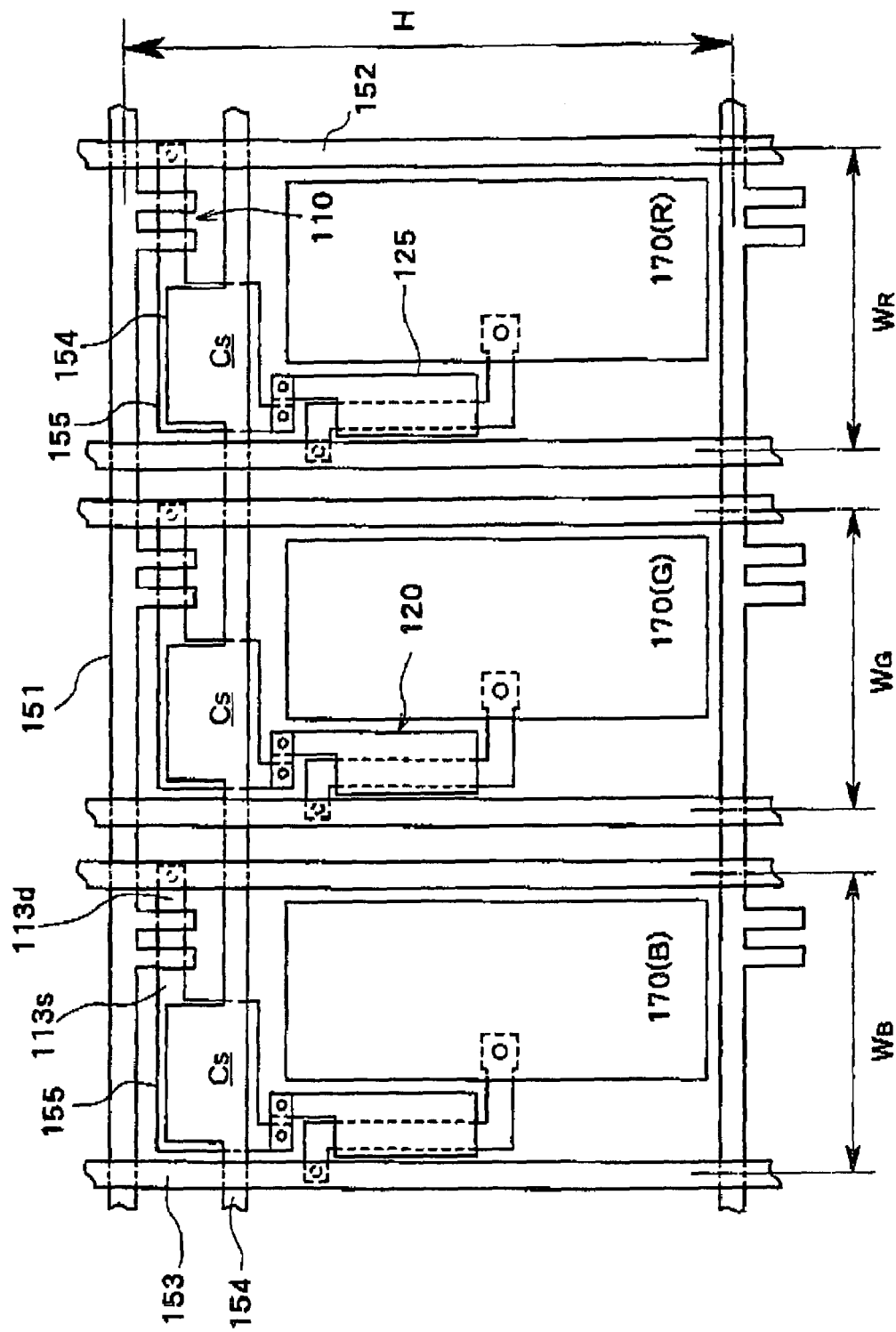
FIG. 1A is a schematic plan view for explaining the configuration of a conventional active matrix type EL display device.
Figure 1B:
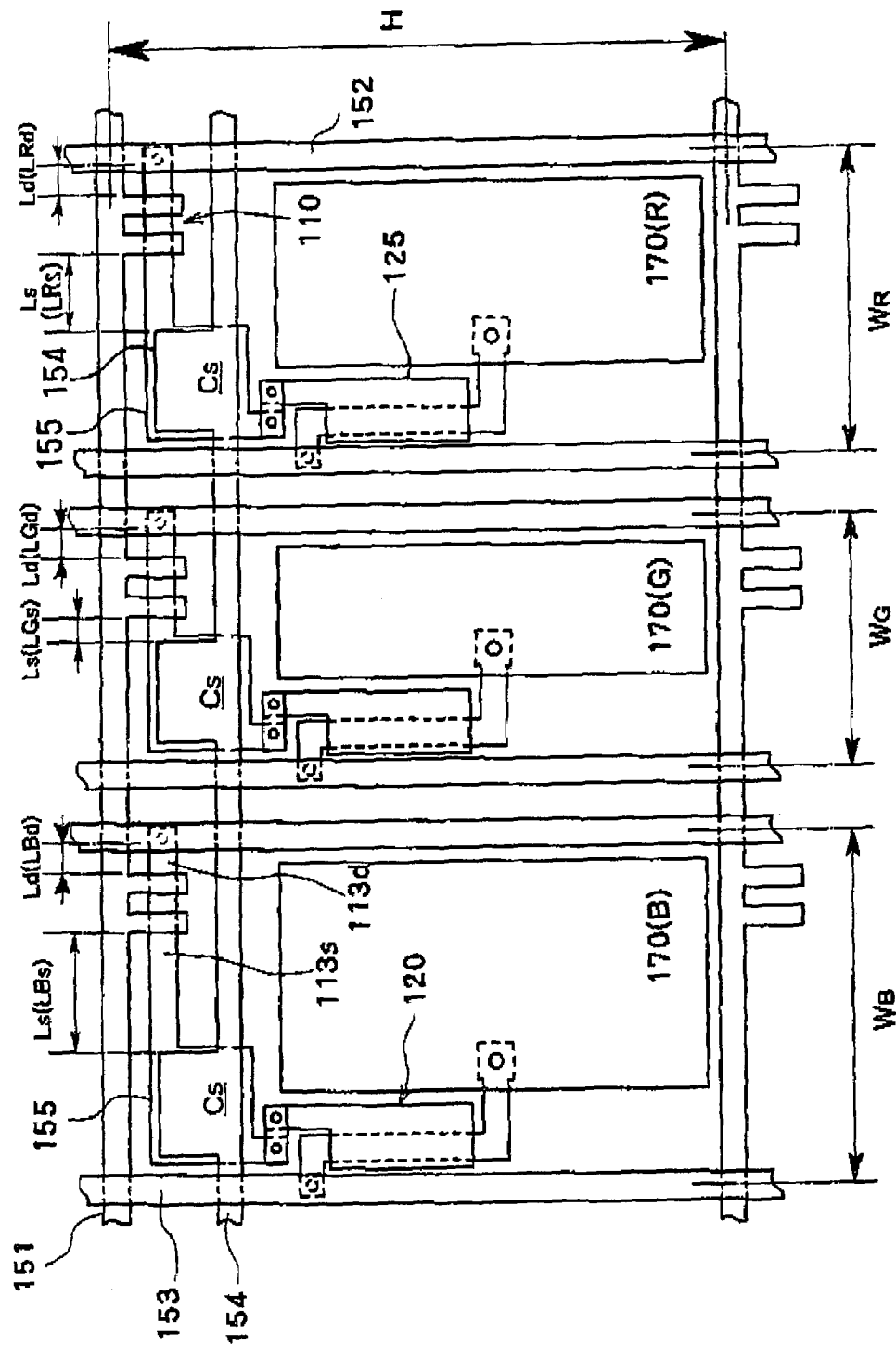
FIG. 1B is a schematic plan view illustrating a related art which may be employed when the areas of the pixel regions in FIG. 1A are varied.
Figure 2:
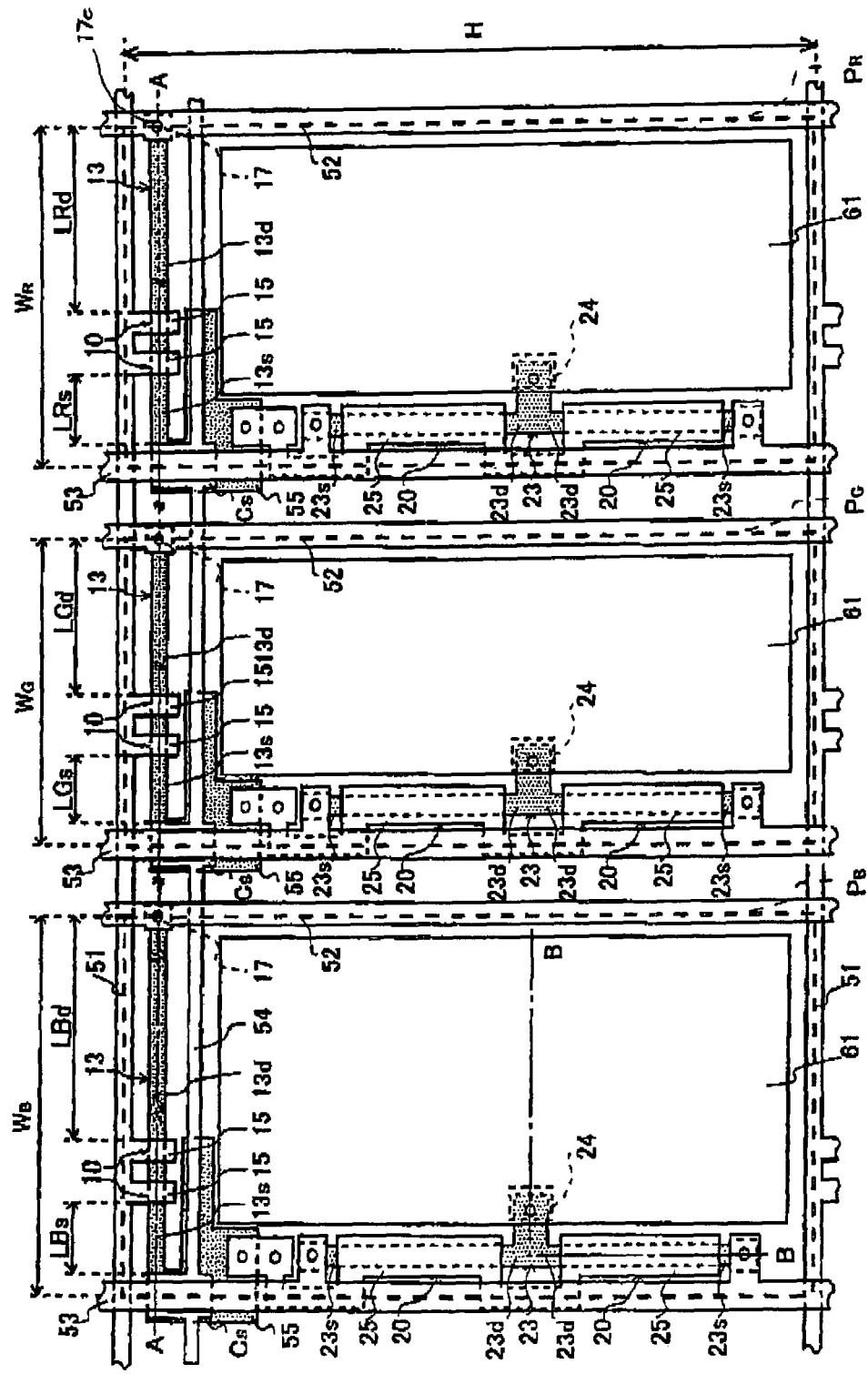
FIG. 2 is a plan view showing pixel regions of an EL display device according to an embodiment of the present invention.
Figure 3A:
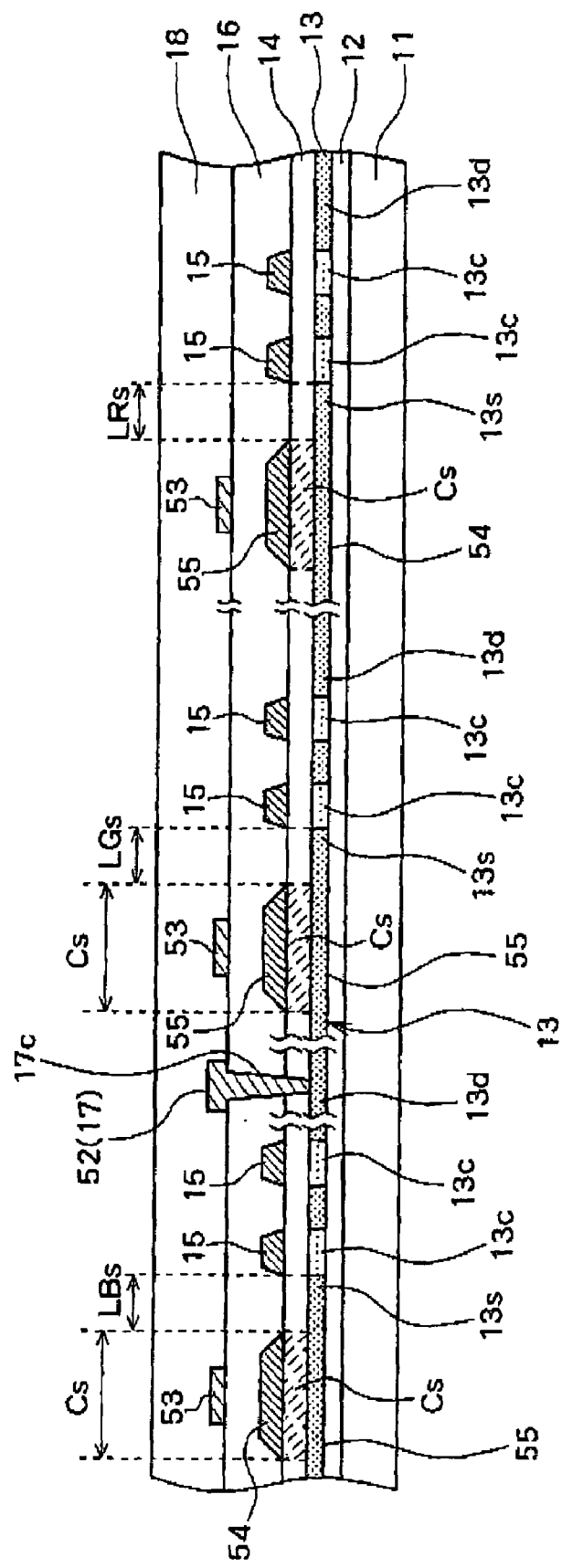
FIGS. 3A and 3B are diagrams showing schematic cross sections of the EL display device taken along lines A—A and B—B of FIG. 2, respectively.
Figure 3B:
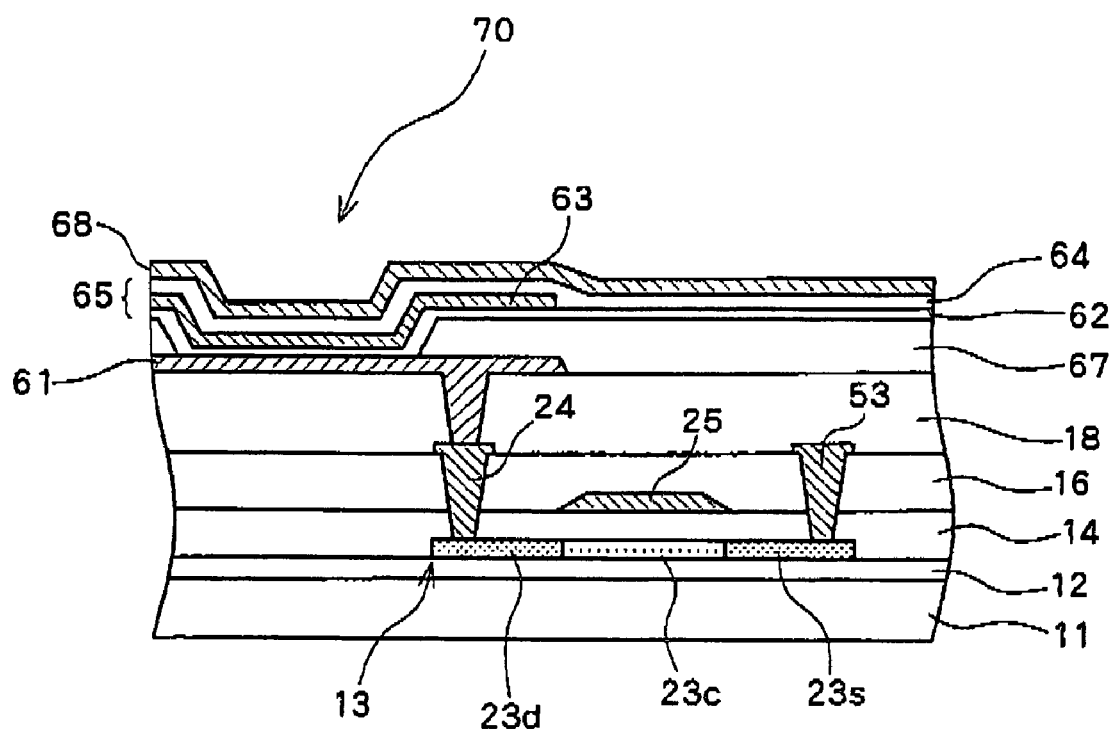
Figure 4:
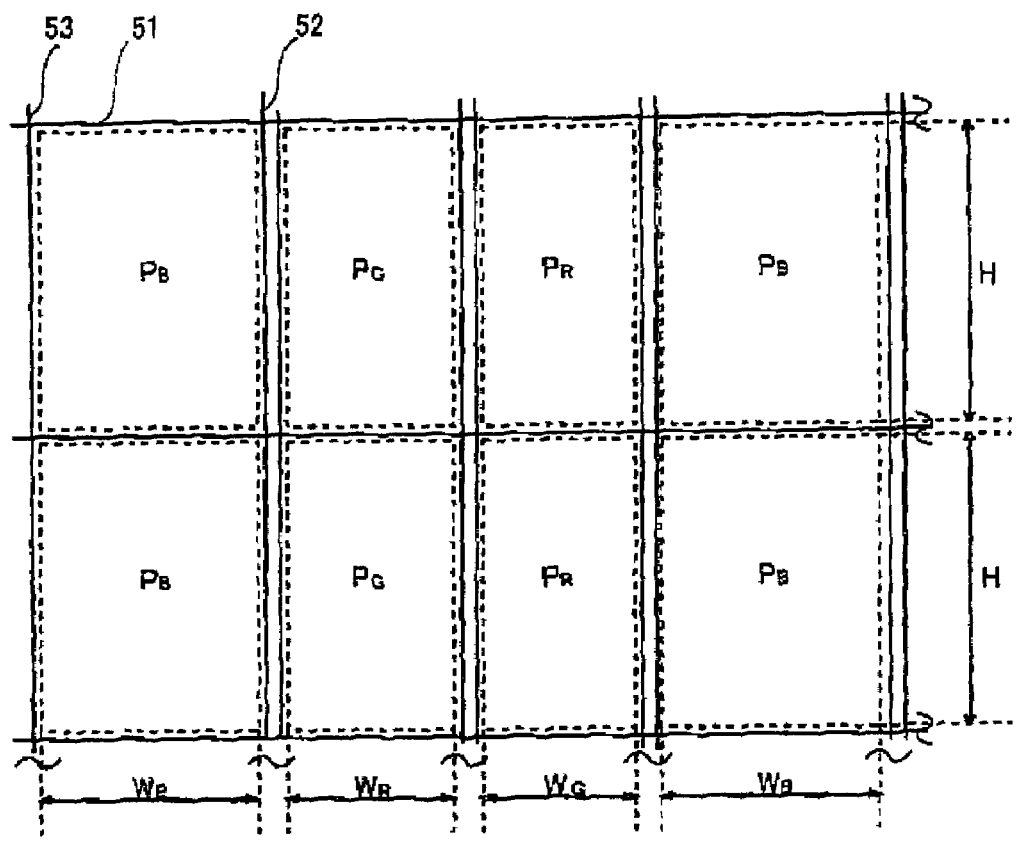
FIG. 4 is a schematic plan view showing an EL display device according to the embodiment of the present invention.

FIG. 2 is a plan view showing pixel regions of a color display device according to an embodiment of the present invention. FIGS. 3A and 3B are diagrams showing schematic cross sections of the color display device taken along lines A—A and B—B of FIG. 2, respectively. Further, FIG. 4 is a simplified diagram showing the pixel regions of FIG. 2. Referring to these drawings, a color display device according to an embodiment of the present invention will be described below using as an example an EL display device including a current-driven EL element in each pixel region.

A plurality of gate signal lines 51 are formed in the horizontal direction of the display, while a plurality of drain (data) signal lines 52 and a plurality of drive power lines 53 are formed in parallel in the vertical direction of the display. Pixel regions $P_R$, $P_G$, $P_B$ corresponding to the respective color components are arranged in regions surrounded by the gate signal lines 51, drain signal lines 52, and drive power lines 53. The pixel regions $P_R$, $P_G$, $P_B$ have equal heights H in the vertical direction (first direction), but their widths $W_R$, $W_G$, $W_B$ in the horizontal direction (second direction) differ from one another, such that areas of the pixel regions differ for different color components to which the pixel regions are correlated.

In each pixel region, two first TFTs 10 connected in series with respect to a drain signal line 52, and portions of a storage capacitor electrode line 54 and storage capacitor electrode 55 are provided between a pixel electrode 61 and a gate signal line 51. The two first TFTs 10, which are the switching elements, include a semiconductor layer 13 having its channel length direction extending in parallel to the gate signal line 51 (i.e., along a third direction, which, in this example, differs from the first direction but is parallel to the second direction). Gates 15 of the first TFTs 10 are connected in parallel to the gate signal line 51, and overlap portions of the semiconductor layer 13. It should be noted that, as described later, the detailed structure is such that a gate insulation film 14 is formed over the semiconductor layer 13, and the gates 15 are actually provided on top of the gate insulation film 14. The regions of the semiconductor layer 13 overlapped by the gates 15 are the channel regions 13c. A source region 13s and a drain region 13d are formed on the respective sides of the channel regions 13c. The drain region 13d provided on the drain signal line 52 side is electrically connected to the drain signal line 52 via a drain electrode 17. The drain electrode 17 may be formed as an integral part of the drain signal line 52. In the present embodiment, this integral formation is employed, and the drain signal line 52 is connected directly to the drain region 13d at the location of a contact hole 17c shown in FIG. 2.

In the embodiment of FIG. 2, in the pixel regions $P_R$, $P_G$, $P_B$ corresponding to the respective color components, the plan view distances LRd, LGd, LBd obtained by projecting onto the display plane surface the extent from each drain signal line 52, or more precisely, the contact location connecting the drain signal line 52 and the drain region 13d of the first TFTs 10, to the drain-side end portion of the gate 15 of the first TFT 10 connected to the drain signal line 52 differ from one another.

The source region 13s of the first TFTs 10, which is not directly connected to the drain signal line 52, is connected to the storage capacitor-electrode 55. The storage capacitor electrode 55 is arranged opposing the storage capacitor electrode line 54 with the gate insulation film 14 interposed therebetween. The region in which the electrode 55 and the electrode line 54 are overlapped constitutes the storage capacitor Cs. The distance Ls (LBs, LGs, LRs) from the storage capacitor Cs, namely, an end portion of the storage capacitor electrode line 54 or the storage capacitor electrode 55 constituting the storage capacitor Cs, to the gate 15 of the first TFT 10 connected to the storage capacitor Cs is identical among the pixel regions $P_R$, $P_G$, $P_B$ corresponding to any of the respective color components.

Further provided in each pixel region are two second TFTs, which are drive elements electrically connected in parallel between the drive power line 53 and the pixel electrode 61 of an organic EL element. Within the semiconductor layer 23 of the second TFTs, the regions overlapped by gates 25 via the gate insulation film 14 constitute channel regions 23c. Source regions 23s and a drain region 23d are formed on the respective sides of each channel region 23c such that each channel region 23c is sandwiched by a source and a drain. The source regions 23s provided for the respective channel regions 23c are each connected to the drive power line 53. The common drain region 23d is connected to a drain electrode 24 and, via this drain electrode 24, to the pixel electrode 61 of the organic EL element. The storage capacitor Cs serves to apply a voltage in accordance with a display content (display information) to the gates of the second TFTs 20 for a predetermined duration during which no voltage is applied from outside the pixel, so as to sustain light emission of the EL element.

The storage capacitor electrode line 54 is formed opposing, via the gate insulation film 14, the storage capacitor electrode 55 which is formed as an integral part of the semiconductor layer 13 and connected to the source region 13 of the first TFTs 10. With this arrangement, charges are accumulated between the storage capacitor electrode line 54 and the storage capacitor electrode 55, thereby generating capacitance. This capacitance serves as the storage capacitor Cs which retains a voltage to be applied to the gates 25 of the second TFTs 20. In the present embodiment, the storage capacitors Cs provided in the respective pixel regions are formed in common shapes (the same shape). It is particularly desirable that the storage capacitors Cs in the pixel regions correlated to different color components have identical capacitance values, and, in order to achieve identical capacitance values, at least the capacitor areas must be made equal. To further facilitate design of a layout providing equal areas, the present embodiment employs the same shape for the storage capacitors Cs in the respective pixel regions. (In this example, as may be apparent, the electrodes 55, electrode lines 54, and gate insulation films 14 constituting the storage capacitors Cs are formed using common materials and under the same conditions for the respective pixel regions.)

The cross-sectional structure of the EL display device according to the present embodiment will next be described referring to FIGS. 3A and 3B.

The region around the first TFTs 10 serving as the switching elements will first be explained. An insulation film 12 composed of a material such as $SiO_2$ film or SiN film is formed as a buffer film on an insulating substrate 11. The semiconductor layer 13 composed of a polycrystalline silicon film is next laminated on top of this structure. The polycrystalline silicon film may be formed by depositing amorphous silicon and subsequently performing polycrystallizing anneal such as laser anneal. The semiconductor layer 13 is, at a later stage, doped with impurities while using gates as masks, so as to create the source 13s and the drain 13d. The channels 13c are formed between the source 13s and the drain 13d in regions overlapped by the gates. The gate insulation film 14 composed of a material such as $SiO_2$ film or SiN film is laminated on the semiconductor layer 13. The gate signal line 51 combined with gates 15 and the storage capacitor electrode line 54 are next formed using a refractory metal such as chrome or molybdenum. The gates 15 are arranged in locations corresponding to the channels 13c. Further on top, an interlayer insulation film 16 composed of a material such as $SiO_2$ film or SiN film is formed over the entire surface. A metal layer made of aluminum or the like is disposed on top of the interlayer insulation film 16. Because a contact hole 17c is created through the interlayer insulation film 16 and the gate insulation film 14 in a location corresponding to the drain region 13d, the metal layer is connected to the drain region 13d through this contact hole 17c. The metal layer serves as the drain signal line 52, and the portion of the metal layer disposed in the contact hole 17c is the drain electrode 17 formed integrally with the drain signal line 52. A planarization film 18 for planarizing a surface is further provided on top covering the entire substrate surface including the drain signal line 52. Further, the source 13s is electrically connected to the storage capacitor electrode 55. In the present embodiment, the semiconductor layer 13 which constitutes the source 13s simultaneously constitutes the storage capacitor electrode 55. Moreover, according to the present embodiment, all of the distances Lfs, LGs, LBs (plan view distances projected onto the display plane surface) from the source 13s to the storage capacitor Cs (the region where the storage capacitor electrode 55 and the capacitor electrode line 54 overlap) are configured identical. As explained above, a storage capacitor Cs as referred to in the present embodiment denotes the region in which the storage capacitor electrode 55 and the capacitor electrode line 54 overlap with the gate insulation film 14 interposed therebetween.

Next described is the region around the second TFTs 20, which are the drive elements for driving the organic EL element or, more specifically, the drive transistors for supplying electric current from the drive power line 53 to the organic EL element. In the following description, films or other layers that are formed simultaneously with those for the above-described first TFTs 10 are labeled with similar or identical reference numerals. The insulation film 12 composed of a material such as $SiO_2$ film or SiN film is formed as a buffer film on the insulating substrate 11. The semiconductor layer 23 composed of a polycrystalline silicon film is next laminated on top of this structure, simultaneously with the semiconductor layer 13 of the first TFTs 10. The semiconductor layer 23 is, at a later stage, doped with impurities so as to create the sources 23s and the drain 23d, and the channels 23c are formed in positions between the sources 23s and the drain 23d. The gate insulation film 14 composed of a material such as $SiO_2$ film or SiN film is laminated on the semiconductor layer 23. The gates 25 are next formed in the same manner as the gates of the first TFTs 10 using a refractory metal such as chrome or molybdenum in locations corresponding to the channels 23c. Further on top, an interlayer insulation film 16 composed of a material such as $SiO_2$ film or SiN film is formed over the entire substrate surface including the gates 25. A metal layer made of aluminum or the like is disposed on top or the interlayer insulation film 16. Because contact holes are created through the interlayer insulation film 16 and the gate insulation film 14 in locations corresponding to the source regions 23s and the drain region 23d, the metal layer is connected through the contact holes to the corresponding source and drain regions 23s, 23d. The metal layer thus simultaneously constitutes the drain electrode 24 and the drive power line 53 combined with the source electrodes. The drive power line 53 is connected to an external power source (not shown), and supplies power from the power source via the source regions 23s, channel regions 23c, and the drain region 23d to the organic EL element 70. The planarization film 18 composed of a resin or the like for planarizing a surface is further provided on top covering the entire substrate surface including the drain electrode 24 and the drive power line 53. Further, a contact hole is created in the planarization film 18 in a location corresponding to the drain electrode 24. A transparent electrode (pixel electrode) composed of ITO (indium tin oxide) is then formed on the planarization film 18 and in the contact hole, such that the transparent electrode contacts the drain electrode 24 via the contact hole. The transparent electrode serves as the lower electrode 61 (which may be the anode) of the organic EL element. Sequentially formed in order over this electrode 61 are, for example, an emissive element layer 65 including a laminated structure composed of a hole transport layer 62, emissive layer 63, and electron transport layer 64, and an upper electrode 66 (e.g. , cathode). The upper electrode 66 may be composed of a material such as an alloy of magnesium and indium, an alloy of magnesium and aluminum, or aluminum. The organic EL element 70 is configured in a region where the above-described electrodes 61 and 66 are arranged opposing one another with the emissive element layer 65 disposed between those electrodes 61, 65.

Figure 5:
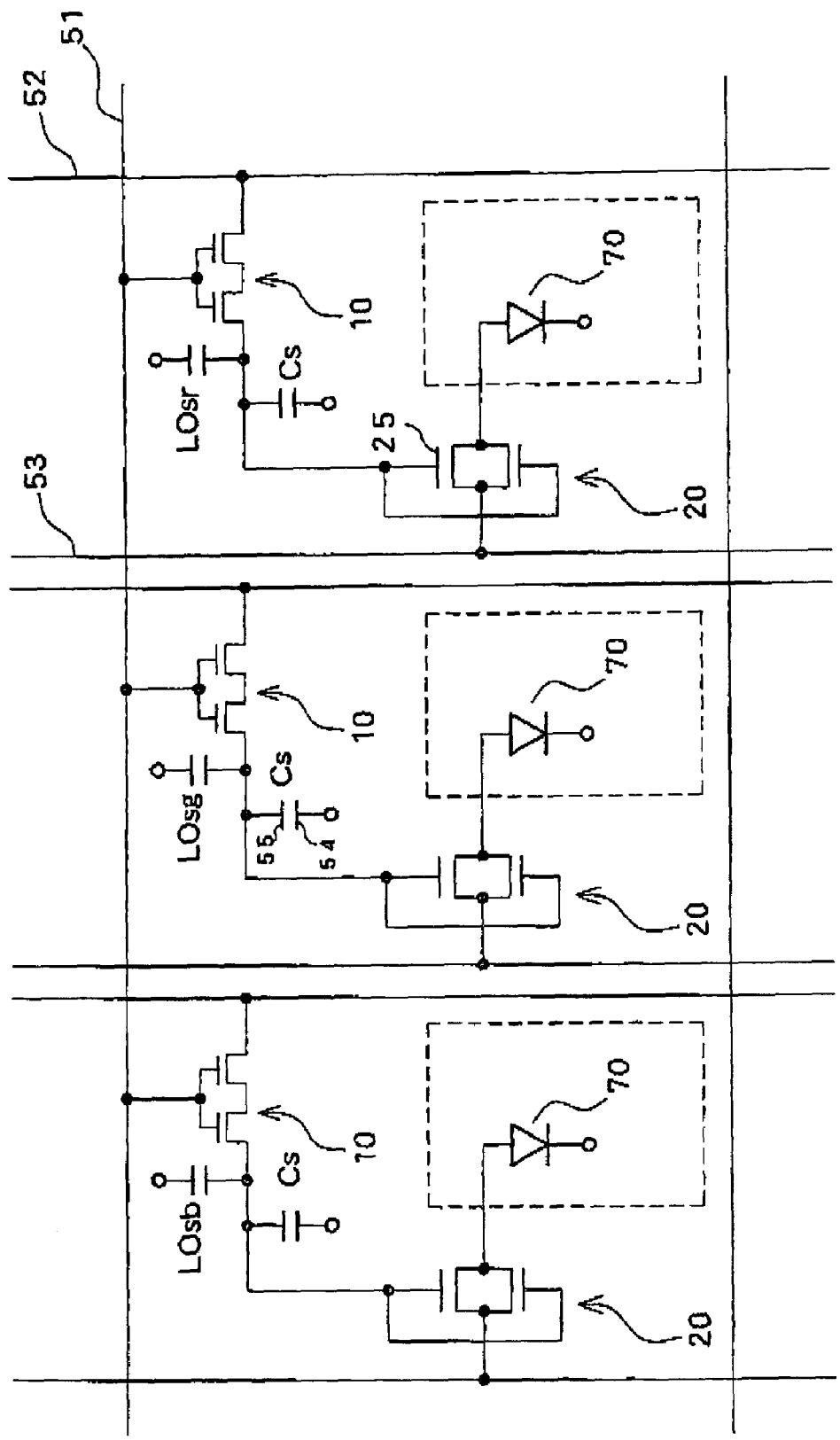
FIG. 5 shows a schematic equivalent circuit for the respective pixel regions according to the embodiment of the present invention.

The display device according to the present embodiment will be further described referring to FIG. 5 which conceptually shows the equivalent circuit of the respective pixel regions of the present embodiment. By applying the invention as configured in present embodiment, which employs the above-described configuration for the pixel regions corresponding to all color components, the distance from a gate 15 of the TFTs 10 to the storage capacitor Cs can be made identical, thereby achieving equal electric load LOs ($LOs_r$, $LOs_g$, $LOs_b$) in each of the pixel regions of R, G, and B. Further, by using the same shape (identical in both size and area) to form the storage capacitor Cs in every pixel region, the capacitance value is also made equal. In this manner, the storage capacitor Cs electrically connected in the path between a channel 13c of the TFTs 10 and a gate 25 of the TFTs 20, as well as the load LOs including parasitic resistance and parasitic capacitance, can be made identical in all the pixel regions. According to this arrangement, the time period during which a signal from the drain signal line 52 is written into the gates of the TFTs 20 via the TFTs 10 can be made identical in any pixel region. Furthermore, a design created for the TPTs and the storage capacitor for a pixel region corresponding to any one of the color components can be employed as is for the pixel regions corresponding to other color components. The amount of time required for pixel design can thereby be greatly reduced, minimizing design costs.

The present invention is not limited to the above-described configuration. The third direction along which the semiconductor layer 13 of the first TFTs 10 is arranged need not be parallel to the second direction (horizontal direction), as long as the third direction intersects the first direction. Various changes can be made in the shapes and positions of the first and second TFTs 10, 20 and/or the storage capacitor electrode in accordance with design patterns. For example, a single TFT 10 may be used or, alternatively, three or more TFTs 10 may be provided in a pixel region. The numbers of TFT 10 and TFT 20 provided within one pixel region need not be equal. In order to effectively reduce the time required for design, the storage capacitor Cs is preferably formed in identical shapes in the respective pixel regions. However, when identical shapes cannot be used due to design reasons or the like, identical signal writing time and rate can be achieved by making the capacitance of the storage capacitor Cs equal in the respective pixel regions.

While all of the widths $W_R$, $W_G$, $W_B$ of the pixel regions corresponding to the respective color components differ from one another in the present embodiment, the present invention may also be applied to a case in which the width of a pixel region for one color component alone differs from the widths of pixel regions for the other color components.

Figure 6:
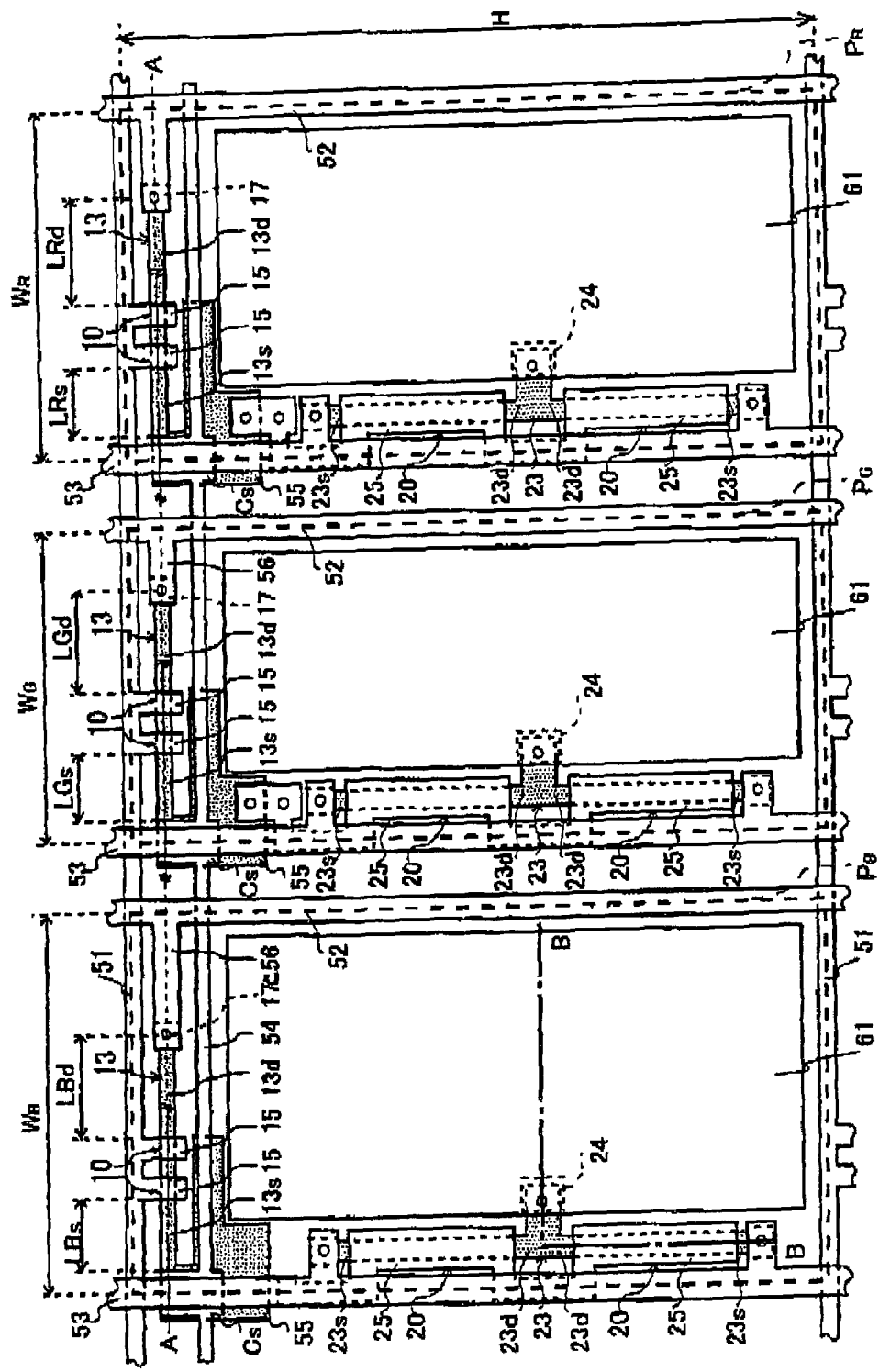
FIG. 6 is a plan view showing pixel regions of an EL display device according to another embodiment of the present invention.

An example alternative embodiment of the present invention is shown in FIG. 6. A drain signal line 52 arranged between pixel regions includes a protruding portion 56 extending in a length specific to each color component. The protruding portion 56 is connected to a drain region 13d by a drain electrode 17 through a contact hole 17c created in the insulation films, In the example shown, the drain electrode 17, protruding portion 56, and the drain signal line 52 may be formed integrally. When this integral formation is employed, the extending distance of the protruding portion 56 from the drain signal line 52 can be adjusted to a desired length by simply changing the pattern of the drain signal line 52 for each pixel region, without requiring addition of any special processing steps. By varying the extending distance from the drain signal line 52, not only LRs, LGs, LBs, but also the distance LRd, LGd, LBd from the drain 13d to the protruding portion 56 (more precisely, a plan view distance obtained by projecting onto the display plane surface the extent from the boundary between the drain 13d and the gate 15 on the signal line 52 side to the contacting portion connecting the protruding portion 56 and the semiconductor layer 13) can also be configured identical among the respective pixel regions having different areas (emissive area based on the area in which the electrode 61 of the organic EL element contacts the emissive element layer 65). Other structures of this embodiment are the same as those of the previously described embodiment.

According to the present embodiment shown in FIG. 6, in the respective pixel regions corresponding to different color components, the distance from the drain signal line 52 (at the contact hole) to the drain-side end portion of the gate 15 of the first TFTs 10 can be configured to have an equal (common) value that is as small as possible. With this arrangement, load generated between the drain signal line 52 and the first TFTs 10 can be minimized and trade uniform in all of the pixel regions $P_R$, $P_G$, and $P_B$. Instead of forming the protruding portion 56 of the drain signal line 52 for every pixel region as in the present embodiment, the present invention may alternatively be practiced by adopting a structure in which no protruding portion 56 is formed in the pixel region having the smallest pixel region width (which may be $P_G$).

According to the present invention, when pixel regions corresponding to different color components have different lengths in one direction and a common (identical) length in another direction, a TFT arranged along a direction intersecting the other direction and a storage capacitor electrode are formed in substantially uniform shapes in the respective pixel regions. When employing this configuration, it is advantageous in that layout of the pixel regions for different colors can be almost standardized. Further, because substantially identical TFT characteristic and retaining characteristic of the storage capacitor can be achieved in every pixel region corresponding to each color component, it becomes unnecessary to adjust or control, according to each color component, the time and rate for writing a signal supplied via the switching TFT into the driving TFT. Using this configuration, the time required for design can be reduced. For example, when designing an EL display device which employs the three color components of RGB, the design time can roughly be reduced to ⅓ that of a conventional device. In this manner, the time required for designing an EL display device can be greatly reduced, thereby also reducing design costs.

The present invention may also be useful in manufacturing a display device which achieves full color display with optimum white balance by providing, in each of the pixel regions, an EL element composed of an identical material for emitting an identical color light, and allocating those pixel regions for emitting lights of the respective colors of R, G, and B, for example. In such a display device, the present invention can be used to vary the emissive areas of the pixel regions in accordance with each color, depending on the desired luminance and the conversion efficiency of a color conversion element such as a color filter, color conversion film, or the like. As a result, the density of current supplied to the EL elements of the respective pixel regions can be made equal even when the desired luminance or other conditions differ among the color components. This obviates any need to drive the EL elements correlated to a specific color at a high current density, thereby preventing faster degradation of certain EL elements compared to others. Further, according to this arrangement, design of the pixel layout and driving of the display device are both facilitated.

What is claimed is:

1. A color display device, comprising:
   a plurality of pixel regions each correlated to a predetermined color component,
   each of the plurality of pixel regions including:
   a first thin film transistor for selectively supplying a signal corresponding to a display information to the pixel region; and
   a storage capacitor connected to the first thin film transistor for retaining the signal corresponding to the display information; wherein
   the plurality of pixel regions are of equal length in a first direction, while a pixel region correlated to a predetermined color component is, in a second direction, of a length which differs from a length of a pixel region correlated to at least one other color component; and
   a channel length direction of the first thin film transistor is arranged along a third direction intersecting the first direction, and a plan view distance obtained by projecting onto a display plane surface an extent from an end portion of a gate of the first thin film transistor to the storage capacitor is identical in the respective pixel regions.

2. A color display device as defined in claim 1, wherein the lengths of the pixel regions in the second direction differ from one another between the pixel regions correlated to different color components.

3. A color display device as defined in claim 1, wherein in each pixel region, the storage capacitor is configured in a region where a storage capacitor electrode and a storage capacitor wiring overlap, and the overlap regions in the respective pixel regions are substantially identical to one another in at least one of area, shape, or capacitance value.

4. A color display device as defined in claim 1, wherein the first thin film transistors provided in the respective pixel regions are of identical shape and size.

5. A color display device as defined in claim 1, further comprising:
a plurality of data signal lines for supplying the display data corresponding to the display information to the respective pixel regions; wherein
the data signal lines are connected to either one of a drain region or a source region of the first thin film transistors.

6. A color display device as defined in claim 5, wherein each of the plurality of pixel regions further includes a pixel electrode and a second thin film transistor connected to the pixel electrode; and a gate of the second thin film transistor is connected to the storage capacitor and the first thin film transistor.

7. A color display device as defined in claim 6, wherein the second thin film transistors in the pixel regions correlated to different color components are of identical shape and size.

8. A color display device as defined in claim 5, wherein a plan view distance obtained by projecting onto the display plane surface an extent from a gate end portion of the first thin film transistor on the data signal line side to a contact location connecting the data signal line and the first thin film transistor is identical in the plurality of pixel regions correlated to different color components.

9. A color display device as defined in claim 5, wherein each of the plurality of pixel regions further includes a pixel electrode and a second thin film transistor connected to the pixel electrode;

a gate of the second thin film transistor is connected to the storage capacitor and the first thin film transistor; and a load generated between the data signal line and the pixel electrode is identical in the plurality of pixel regions correlated to different color components.

* * * * *